United States Patent
Katzin et al.

(10) Patent No.: US 10,014,826 B2
(45) Date of Patent: Jul. 3, 2018

(54) APPARATUS AND METHODS FOR POWER ENHANCEMENT OF SELF-BIASED DISTRIBUTED AMPLIFIERS WITH GATE BIAS NETWORKS

(71) Applicant: ANALOG DEVICES, INC., Norwood, MA (US)

(72) Inventors: Peter J. Katzin, Arlington, MA (US); Haoyang Yu, Lexington, MA (US); Guogong Wang, Chelmsford, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 14/965,580

(22) Filed: Dec. 10, 2015

(65) Prior Publication Data

US 2017/0170787 A1     Jun. 15, 2017

(51) Int. Cl.
*H03F 3/193* (2006.01)
*H03F 1/02* (2006.01)

(52) U.S. Cl.
CPC ......... *H03F 1/0205* (2013.01); *H03F 1/0272* (2013.01); *H03F 3/193* (2013.01); *H03F 3/1935* (2013.01); *H03F 2200/102* (2013.01); *H03F 2200/129* (2013.01); *H03F 2200/144* (2013.01); *H03F 2200/153* (2013.01); *H03F 2200/18* (2013.01); *H03F 2200/451* (2013.01)

(58) Field of Classification Search
CPC .................................................... H03F 3/193
USPC .................... 330/140, 279, 94–96
See application file for complete search history.

(56) References Cited

U.S. PATENT DOCUMENTS

| | | | | |
|---|---|---|---|---|
| 3,999,060 A | * | 12/1976 | Skagerlund | H03F 3/08 136/291 |
| 4,422,049 A | * | 12/1983 | Akagiri | H03G 7/002 330/134 |
| 4,594,559 A | * | 6/1986 | Bernzweig | H03F 3/183 324/329 |
| 4,859,965 A | | 8/1989 | Paolella et al. | |
| 5,043,672 A | * | 8/1991 | Youn | H03G 3/3042 330/129 |
| 5,208,550 A | * | 5/1993 | Iwane | H03G 3/3042 330/129 |
| 5,311,143 A | | 5/1994 | Soliday | |
| 5,434,537 A | * | 7/1995 | Kukkonen | H03G 3/3042 330/140 |
| 5,960,333 A | * | 9/1999 | Repke | H03G 3/3047 330/137 |
| 6,049,250 A | | 4/2000 | Kintis et al. | |
| 6,137,357 A | * | 10/2000 | Dekker | H04W 52/52 330/129 |
| 6,819,180 B2 | | 11/2004 | Krvavac | |

(Continued)

*Primary Examiner* — Henry Choe
(74) *Attorney, Agent, or Firm* — Knobbe, Martens, Olson & Bear, LLP

(57) ABSTRACT

Provided herein are apparatus and methods for power enhancement of self-biased distributed amplifiers with gate bias networks. By sampling output power a gate bias network with a filter network can adjust gate bias so as to improve the P1 dB compression point and the Psat saturation power level of a self-biased distributed amplifier. Advantageously the filter network can be derived using passive components thereby making it an easy to implement and cost effective approach to improve linearity and output power.

20 Claims, 6 Drawing Sheets

(56) References Cited

U.S. PATENT DOCUMENTS

| | | | |
|---|---|---|---|
| 7,148,749 B2* | 12/2006 | Rahman | H03G 3/3047 |
| | | | 330/279 |
| 7,358,807 B2* | 4/2008 | Scuderi | H03F 1/52 |
| | | | 330/140 |
| 7,414,479 B2 | 8/2008 | Ripley et al. | |
| 2014/0070891 A1* | 3/2014 | Shibuya | H03F 1/0272 |
| | | | 330/296 |
| 2015/0084690 A1 | 3/2015 | Cusmai et al. | |

\* cited by examiner

APPARATUS AND METHODS FOR POWER ENHANCEMENT OF SELF-BIASED DISTRIBUTED AMPLIFIERS WITH GATE BIAS NETWORKS

BACKGROUND

Field

Embodiments of the invention relate to electronic circuits, and more particularly, to radio frequency (RF) amplifiers with gate bias networks.

Description of the Related Technology

A radio frequency (RF) amplifier can use distributed amplifiers to amplify RF signals with improved linearity. The distributed amplifiers can be formed using field effect transistors (FETs) or bipolar transistors tailored for high frequency operation. For instance, a distributed amplifier can be fabricated using GaAs high-electron-mobility transistors (HEMTs) or SiC metal semiconductor FETs (MESFETs).

One application is power amplification. An RF amplifier can be used in a communication system to amplify an RF signal for transmission at an antenna or cable.

SUMMARY

In one embodiment an apparatus comprises an electronic device, a power detection circuit, and a control path. The electronic device has at least a first terminal, a second terminal, and a third terminal; and the electronic device is part of an output stage of a radio frequency (RF) power amplifier. The power detection circuit is coupled to an output node of the output stage; and the power detection circuit is configured to generate a detection output at a detection node. The control path is disposed between the detection node of the power detection circuit and the first node of the electronic device; and the control path consists of a passive low-pass filter network. Also, the control path is configured to provide a boost to a bias of the electronic device to reduce gain compression.

The output stage can further comprise a plurality of electronic devices in parallel for a distributed architecture. In addition, the power detection circuit can be capacitively coupled to the output node of the output stage. Or the power detection circuit can be coupled to the output node of the output stage by a coupled line coupler. Also, the power detection circuit can comprise a rectifier.

The passive filter network can comprise a low-pass filter network with at least a first resistor, a second resistor, and a capacitor. An amount of capacitance of the capacitor and an amount of first resistance associated with the first resistor can determine an attack rate of the boost to the bias. In addition, the amount of capacitance and an amount of second resistance associated with the second resistor can determine a decay rate of the boost to the bias.

The electronic device can be self biased via a resistor coupled to the second terminal. The electronic device can comprise a field effect transistor with the first terminal corresponding to a gate, the second terminal corresponding to a source, and the third terminal corresponding to a drain. The field effect transistor can either be an enhancement mode field effect transistor or a depletion mode field effect transistor. Also, the field effect transistor can be either an n-type or a p-type field effect transistor.

The electronic device can also comprise a bipolar junction transistor with the first terminal corresponding to a base, the second terminal corresponding to an emitter, and the third terminal corresponding to a collector. The bipolar junction transistor can either be an npn bipolar junction transistor or a pnp bipolar junction transistor.

In another embodiment an apparatus comprises a radio frequency (RF) power amplifier, a power detection circuit, and a control path. The RF power amplifier has at least an input node and an output node. The power detection circuit is coupled to the output node and is configured to generate a detection output at a detection node. The control path is disposed between the detection node of the power detection circuit and the input node of the RF power amplifier; and the control path consists of a passive filter network. Also, the control path is configured to provide a boost to a bias of the RF power amplifier to reduce gain compression.

The RF power amplifier can further comprise a plurality of amplifiers in parallel for a distributed architecture. In addition, the power detection circuit can be capacitively coupled to the output node. Or the power detection circuit can be coupled to the output node by a coupled line coupler. Also, the power detection circuit can be configured to detect an envelope of a signal at the output node.

The passive filter network can comprise a low-pass filter network with resistors and at least one storage element such as a capacitor or an inductor.

In another embodiment a method of amplifying comprises: self biasing a radio frequency (RF) power amplifier; detecting an output power level of the RF power amplifier to generate a power detection signal; processing the power detection signal only with a passive filter network to generate a control signal; and applying the control signal to an input of the RF power amplifier to adjust a bias of the RF power amplifier. The RF power amplifier has at least an input node and an output node, and the bias of the RF power amplifier is adjusted to reduce gain compression.

The RF power amplifier can further comprise a plurality of amplifiers in parallel for a distributed architecture. The detecting an output power level of the RF power amplifier can further comprise envelope detecting; and the passive filter network can comprise a low-pass filter network.

BRIEF DESCRIPTION OF THE DRAWINGS

These drawings and the associated description herein are provided to illustrate specific embodiments of the invention and are not intended to be limiting.

DETAILED DESCRIPTION OF EMBODIMENTS

Figure 1:
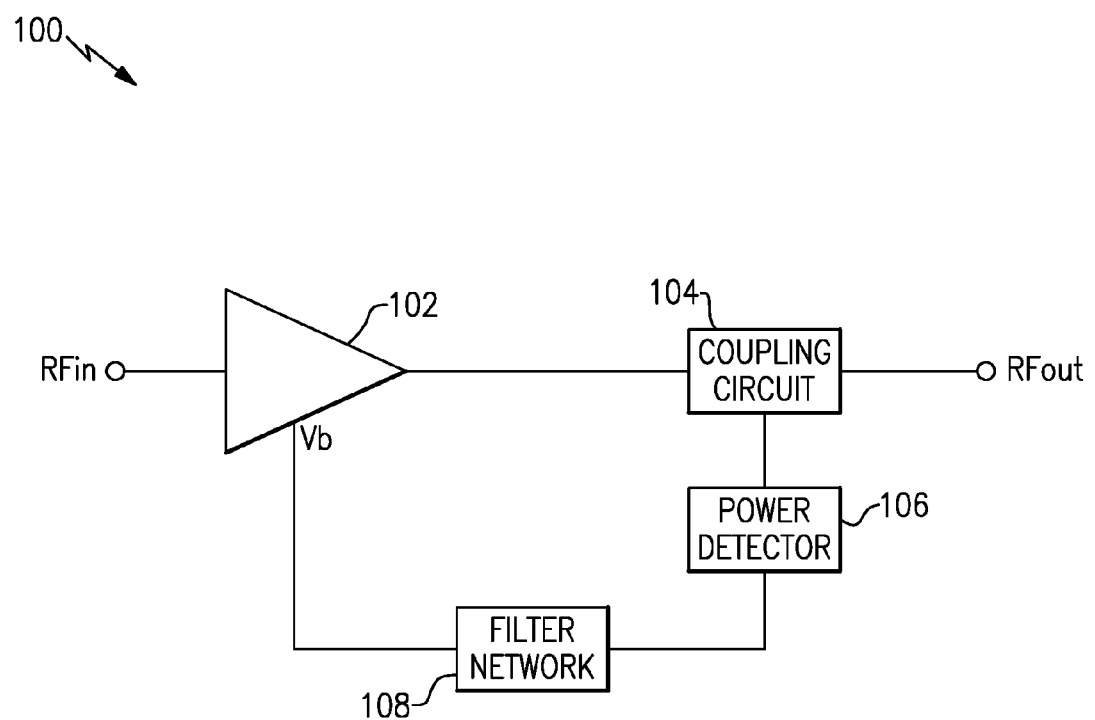
FIG. 1 is a system of a self-biased amplifier with a gate bias filter network according to an embodiment of the invention.

The following detailed description of embodiments presents various descriptions of specific embodiments of the invention. However, the invention can be embodied in a multitude of different ways as defined and covered by the claims. In this description, reference is made to the drawings in which like reference numerals may indicate identical or functionally similar elements.

To meet the demands of high speed data transmission in modern telecommunication systems, distributed amplifiers can be implemented as a technique to increase bandwidth. Using active devices such as FETs (field effect transistors) or bipolar transistors, distributed amplifiers can cascade or distribute two or more active devices to enhance bandwidth.

Amplification stages formed using active devices use stable biasing techniques to mitigate variations in nonlinear device behavior, such as gain, and in environment, such as temperature, imposed upon the amplifier. One method of biasing active devices and amplifier stages is emitter or source degeneration whereby an impedance is intentionally placed in series with the source of an active FET or with the emitter of an active bipolar transistor. For instance, a common source FET or common emitter bipolar transistor configured as a Class-A amplifier can be self-biased by the addition of a source/emitter resistor.

Unfortunately, the inclusion of a source/emitter resistor for self-biasing an amplification stage can reduce the P1 dB, the output power when the amplifier is at the 1 dB compression point, and Psat, the output power when the amplifier is saturated, which are figures of merit for an RF amplifier. In addition, for large input signal swings, the source/emitter resistor can lead to compression, a nonlinear effect. Therefore, there is need for a circuit approach to improve the P1 dB and Psat characteristics of a self-biased distributed amplifier and to mitigate nonlinear effects including compression.

Apparatus and methods for power enhancement self-biased distributed amplifiers with gate bias networks are presented herein. By sampling output power a gate bias network with a filter network can adjust gate bias so as to improve the P1 dB and Psat figures of merit, or simply the P1 dB point and Psat. Advantageously the filter can be derived using passive components thereby making it an easy and cost effective approach to improve linearity and output power.

The power at 1 dB compression (P1 db) and saturated power Psat of self-biased distributed amplifiers can be improved by inserting a network from the output to the gate bias. The output power is sensed and converted to a DC signal, which is applied back to the gate bias. The adjusted gate bias compensates the quiescent current drop for self-biased amplifiers when driven to P1 dB point and improves the P1 db and Psat. Self-biased distributed amplifiers without adjusted gate bias compensation show lower P1 dB and Psat by comparison.

FIG. 1 is a system 100 of a self-biased amplifier 102 with a gate bias filter network 108 according to an embodiment of the invention. The system 100 includes the self-biased amplifier 102, a coupling circuit 104, a power detector 106, and the gate bias filter network 108. The system 100 receives an RF input signal RFin and provides an RF output signal RFout. The self-biased amplifier 102 receives power from a power supply Vdd and receives the RF input signal RFin. The output of the self-biased amplifier 102 is coupled to the coupling circuit 104 which receives an amplified signal from the self-biased amplifier 102 and provides the RF output signal RFout. The coupling circuit couples a relatively small portion of the power from the RF output signal RFout and provides a sample of the power signal to the power detector 106. The power detector 106 detects a power of the sampled power signal to indirectly assess the power level of the RF output signal RFout. The power detector 106 provides a detection output to the gate bias filter network 108; the gate bias filter network 108 then filters the detection output so that it can be applied as a bias signal Vb at a network port labelled Vb of the self-biased amplifier 102.

The self-biased amplifier 102 can represent a single active element, such as an FET, or alternatively can represent a plurality of amplification cells from a distributed amplifier having more than one active element and can use FETs or bipolar transistors. Also, the gate bias filter network 108 can provide the filtered output signal to one or more gates of active elements. The active elements can be depletion mode FETs or enhancement mode FETs. Additionally, the gates can be the bases of bipolar transistors in the case of an RF amplifier realized using a bipolar process.

Figure 2:
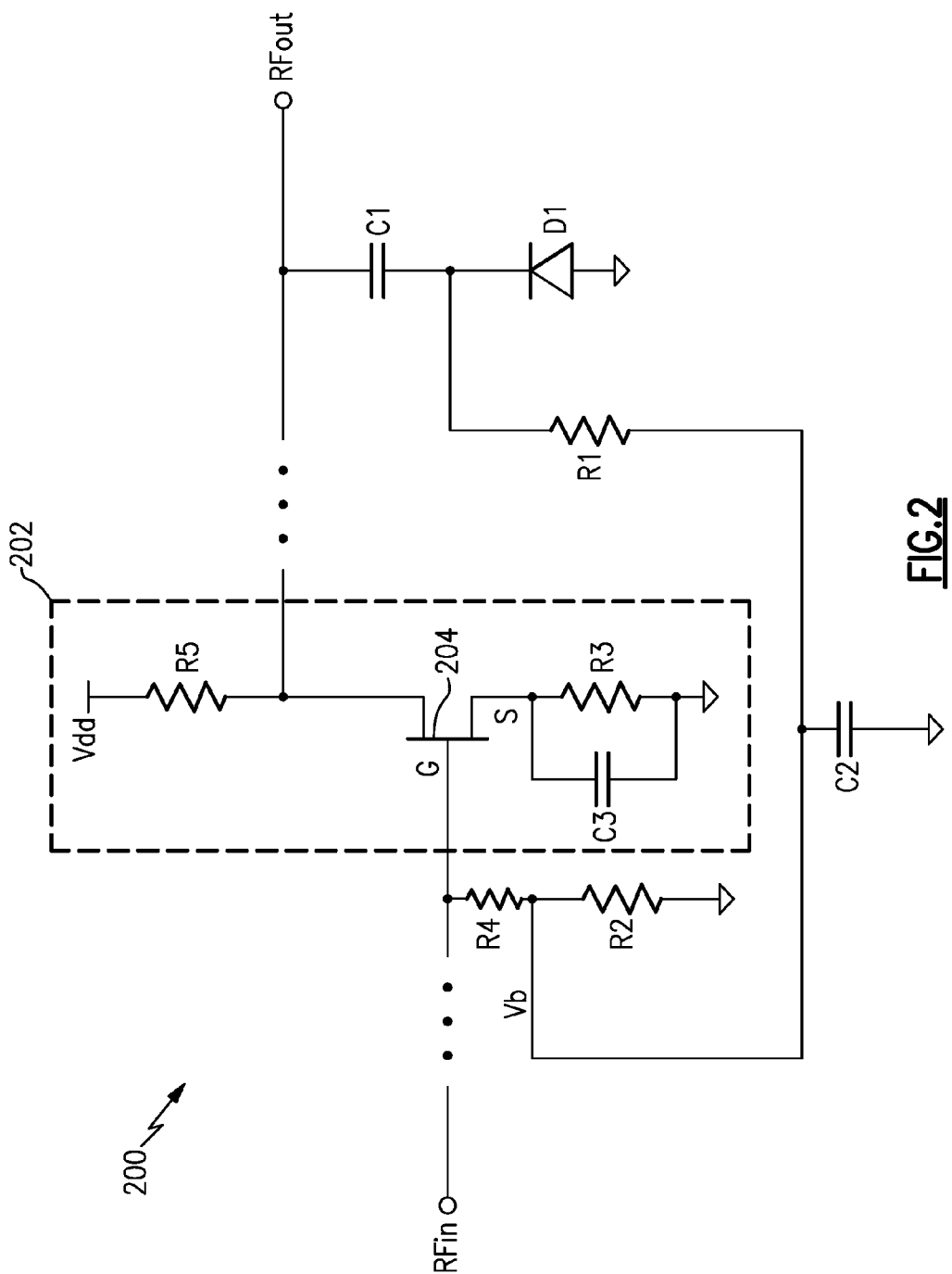
FIG. 2 is a field effect transistor (FET) realization of the system of a self-biased amplifier with a gate bias filter network according to an embodiment of the invention.

FIG. 2 is an example of a field effect transistor (FET) realization 200 of the system 100 of a self-biased amplifier 202 with a gate bias filter network according to an embodiment of the invention. As shown in FIG. 2, the FET realization 200 receives an RF input signal RFin at an input port RFin and provides an RF output signal RFout at an output port RFout. The self-biased amplifier 202 has an FET 204 with a gate G, a source S, and a drain configured as a Class A amplifier. In this configuration the drain provides amplification of an RF input signal applied to the gate G. The RF input signal at the gate G is coupled to the RF input signal RFin; also, in certain embodiments, more than one stage of active devices can be interposed between the RF input signal RFin and the gate G, while more than one stage of active devices can be interposed between the drain of the FET 204 and the RF output signal RFout.

Also as shown in FIG. 2, the FET realization 200 has a capacitor C1, a diode D1, a resistor R1, a capacitor C2, a resistor R2, a capacitor C3, a self bias resistor R3, a resistor R4, and a resistor R5. The capacitor C1 is electrically connected between the output port RFout and the cathode of the diode D1. The anode of the diode D1 is electrically connected to ground. Self bias is implemented with the self-bias resistor R3 electrically connected between the source S and ground; also coupling is provided by a capacitor C3 connected in parallel with the self bias resistor R3. At RF frequencies, the capacitor C3 can operate as a relatively low impedance or short so as to improve an RF gain of the FET realization 200 of a distributed amplifier. As shown in FIG. 2, the resistor R1 is electrically between the cathode of the diode D1 and the network port Vb. The capacitor C2 is electrically connected between the network port Vb and a DC voltage reference, which in the illustrated example is ground. The resistor R4 is electrically connected between the gate G and the network port Vb, while the resistor R2 is electrically connected between the network port Vb and ground.

As shown in the configuration of FIG. 2, the resistor R5 is electrically connected between the drain of the FET 204 and the supply Vdd to provide a load to the self-biased amplifier 202. Although the load is the resistor R5, other configurations are possible. For instance, the load could comprise just a reactive component such as an inductor; or in addition to having the resistor R5, the load could also comprise reactive components such as parallel- and series-connected inductors.

In comparing the system 100 of FIG. 1 with the FET realization of FIG. 2, the capacitor C1 can function as the coupling circuit 104 while the diode D1 can operate as the power detector 106. The resistors R1, R2, and R4 form a low pass network with the capacitor C3 and operate as the gate bias filter network 108.

The capacitor C1 samples power from the RF output signal RFout network, and the diode D1 rectifies voltage from the sampled power to provide a detected signal or voltage. The filter network can then low-pass filter the detected voltage to provide the bias signal Vb at the network port Vb.

A DC component of a drain current of the FET 204 can increase with an RF input power at the gate G. Because the drain current also flows through the self bias resistor R3, the gate-source voltage generated by the self bias resistor R3 will increase with the RF input power as well. For instance, as the drain current of the FET 204 increases and the FET realization 200 of FIG. 2 transitions from low-level or small-signal operation to large-signal operation, a gate-source voltage drop can change from −0.53V to −0.6V. When there are large signal swings of the RF input power at the gate G, a voltage across the self bias resistor R3 increases so as to prevent or reduce an increase drain current. Unfortunately, the increase in voltage across the self bias resistor R3 can undesirably cause gain compression with large signals. By using the gate bias filter network to provide the bias signal Vb to supplement gate biasing, gain compression can be reduced or eliminated.

A small amount of the RF output power is rectified by the diode D1. The rectified DC component is voltage divided by resistor R1 and R2 and applied to the gate G for biasing. When there is no RF input power at the gate G, then the gate bias filter network can be neglected. In this way, the gate bias filter network, having only passive components including resistors and capacitors, can advantageously be implemented with relatively little additional circuitry and can be configured to cause little or no change in operating quiescent current.

When a power level of the RF output signal RFout reaches a certain level, the gate bias filter network can provide an adjusted DC voltage to the gate of the FET 204 via the network port Vb so as to compensate for the increased voltage drop across the self bias resistor R3. This in turn can change the bias level of the FET 204 such that the P1 dB point and Psat are enhanced.

Advantageously, due to implementation of the gate bias filter network via passive components, the FET realization 200 of FIG. 2 can enhance the P1 dB point and Psat figures of merit with little to no increase in chip area. Depending on the applications, the RF output power RFout can be coupled by the capacitor C1 or by a coupled line coupler. Also, as a compact area advantage, the diode D1 and the resistor R1 can be fabricated as part of an integrated circuit, and the diode and the resistor can occupy a small or negligible fraction of the total die area.

The resistor R1 and the resistor R2 can further provide a coupling factor to conveniently control an intensity of the detected output of the RF output signal RFout. This can allow a degree of freedom when the output power of the RF output signal varies.

The FET realization 200 of FIG. 2, can be designed as a monolithic integrated circuit (MIMIC) using a FET process technology such as a CMOS (complementary metal oxide semiconductor) process. In certain configurations the FET 204 can be a depletion mode transistor. The diode D1 can be selected to have an area suitable for rectifying the RF output signal RF over a range of output power levels. In one embodiment, a resistance of the resistors R1 and R2 can each be about 1000 ohms to within a process tolerance. In other embodiments the resistance of the resistors R1 and R2 can be of different values. For instance the resistance of resistor R1 can be about 1000 ohms the resistance of the resistor R2 can be about 1250 ohms. The capacitor C1 can be chosen to have a relatively small capacitance, such as 0.2 pF, so as not to load the RF output signal RFout. The size of the capacitance of the capacitor C1 can be chosen to detect or couple the RF output signal RFout at a sufficient level without loading the output, and it can vary with the size of the diode D1. Further, it can be adjusted in size and capacitance so as to adjust a coupling sensitivity. Other amounts of resistance and capacitance will be applicable and will be readily determined by one of ordinary skill in the art.

The selection of the capacitance and resistance values of the resistors R1, R2, R4, and C2 can be chosen based upon design constraints including RF output loading and a filter time constant. As described above, the resistor R1 can have a resistance value such as 1000 ohms so that it is large enough to not draw or load a large amount of power from the RF output signal RFout while not so large that it causes a filter time constant to be large. In general, time constants can vary directly with the value of resistance, such as the resistance of resistor R1, and also with capacitance, such as the capacitance of capacitor C2.

A time constant associated with the resistor R1 and the capacitor C2 is also referred to as an attack time constant. The resistance of resistor R1 directly affects the attack time constant. Also, a time constant associated with the resistor R2 and capacitor C2 relates to fall time. As the resistance of R2 decreases, the fall time decreases. As described above, it can have a resistance equal to or different from the resistance of the resistor R1.

In some embodiments, the low pass filter time constants can be selected to have a low value, meaning having a short time constant, so as to follow a signal envelope and respond to peaks of the RF output signal RFout. In other embodiments, the low pass filter time constants can be selected to have larger values so as to trigger on an average value of the RF output signal RFout.

Advantageously, the diode D1, the resistors R1, R2, and R4, and the capacitors C1 and C2 can be integrated within the FET realization 200 of a distributed amplifier including the FET 204 with little or no increase in chip area. Also, although the embodiment of FIG. 2 shows one configuration, other configurations are possible. For instance, the capacitor C1 can be replaced with a coupler. Also, in some configurations the diode D1 can be replaced by a component such as a transistor or a thermistor; and the FET 204 can be an enhancement mode FET. Or alternatively, the FET 204 can be replaced by a bipolar transistor; alternatively instead of using a CMOS process, an HBT or III-V semiconductor process, such as GaAs, could be used to realize a distributed amplifier with a gate bias feedback network.

Figure 3A:
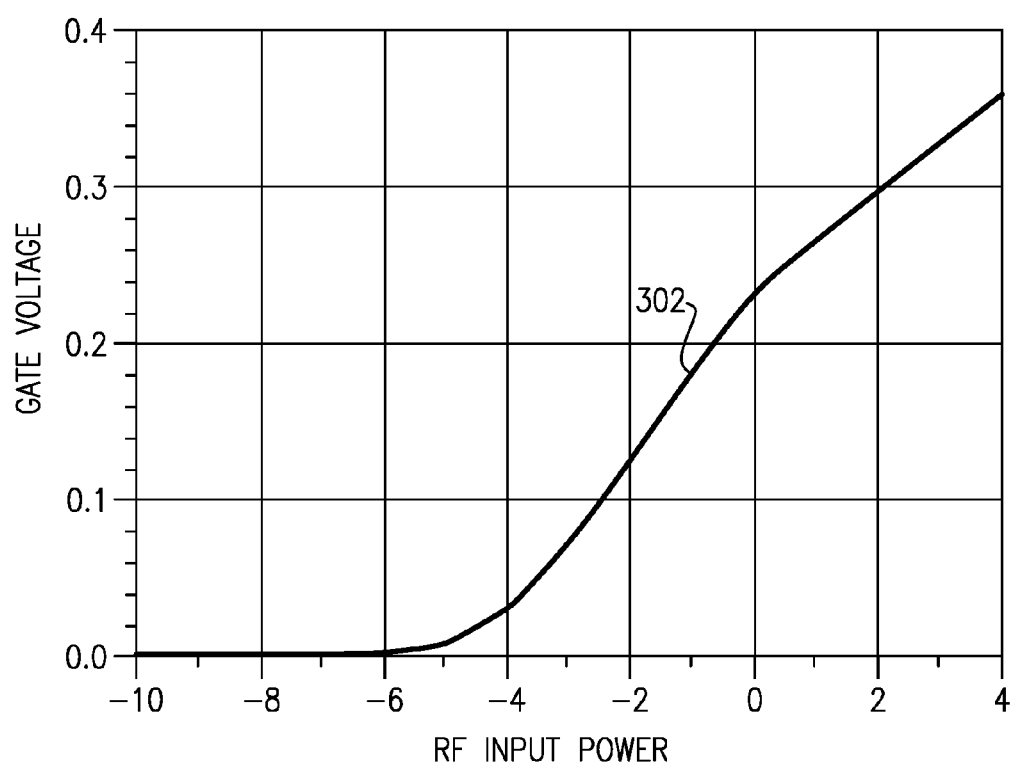
FIGS. 3A and 3B show gate voltage and gate-to-source voltage vs. RF input power of a field effect transistor self-biased amplifier with a gate bias filter network according to an embodiment.
Figure 3B:
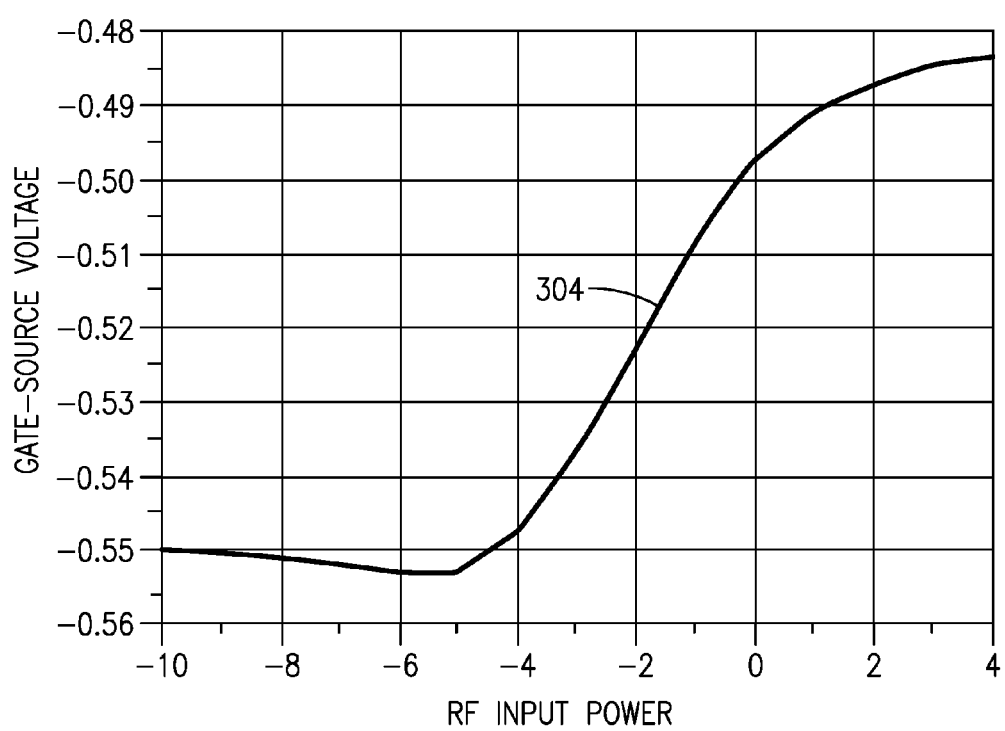

FIGS. 3A and 3B show gate voltage 302 and gate to source voltage 304 vs. RF input power of a field effect self-biased amplifier with a gate bias filter network according to a simulation of an embodiment. The embodiment can be the FET realization 200 having the FET 204 with the gate G and the source S as shown in FIG. 2. Referring to FIGS. 3A, 3B, and FIG. 2, the RF input power can be the RF input power of the RF input signal RFin. The gate voltage 302 can be the voltage at the gate of the FET 204 as provided from the gate bias feedback network via the bias signal Vb. As shown in FIG. 3A on the log scale of the RF input power axis, for relatively low values of input power, less than −6 dBm, the gate voltage is zero or almost zero. As the input power increases from −6 dBm, the gate voltage at the gate G increases due to an increase in the bias signal Vb provided from the gate bias feedback network. As shown in FIG. 3B on the log scale of the RF input power axis, for relatively low values of input power, less than −6 dBm, the gate to source voltage of the FET 204 decreases due to the voltage across the self bias resistor R3. Then, as the input power increases from −6 dBm, the gate-to-source voltage of the FET 204 increases, instead of decreasing, due to the compensating effect of the bias signal Vb provided from the gate bias feedback network. This increase in the gate voltage 302 and overall increase in the gate to source voltage 304 compensates or counteracts the rising voltage across the self bias resistor R3 so as to reduce gain compression and to improve the P1 dB point and Psat.

Figure 4A:
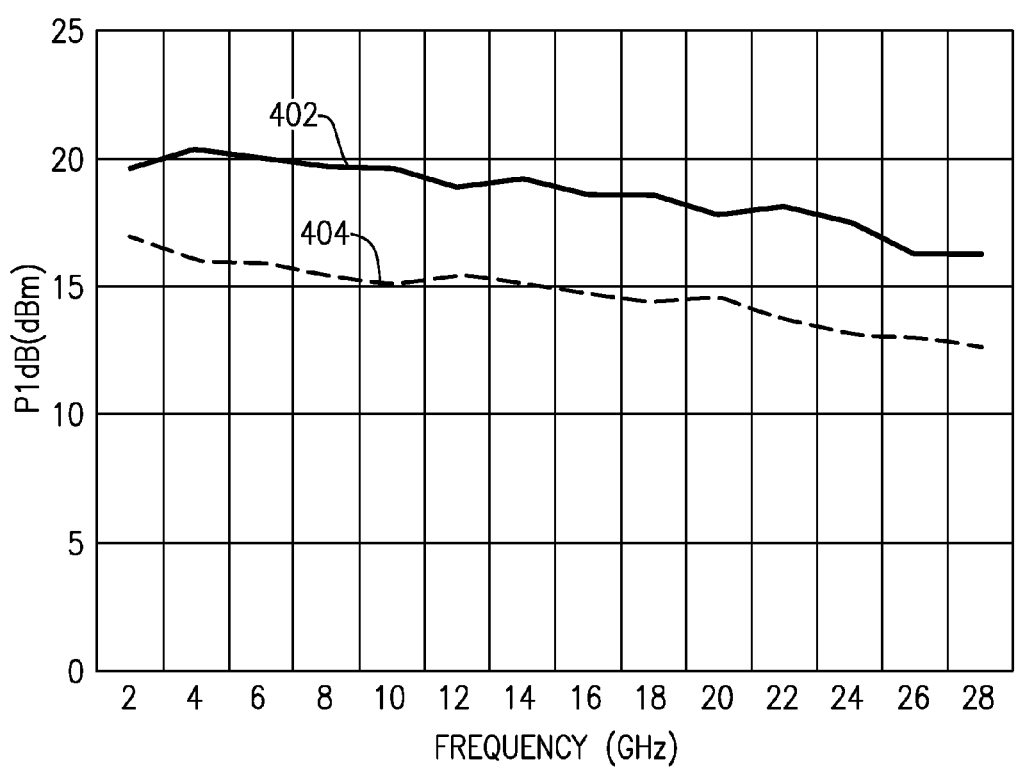
FIG. 4A illustrates measured results comparing a plot of 1 dB compression point (P1 dB) vs. frequency of a self-biased amplifier with a gate bias filter to a plot of P1 dB vs. frequency of a self-biased amplifier without a gate bias filter.

FIG. 4A illustrates measured results comparing a plot 402 of 1 dB compression point P1 dB vs. frequency of a self-biased amplifier with a gate bias filter to a plot 404 of P1 dB vs. frequency of a self-biased amplifier without a gate bias filter. The plot 402 can represent the P1 dB of an embodiment such as the FET realization 200 shown in FIG. 2, while the plot 404 can represent the P1 dB of an embodiment such as the FET realization 200 but without the gate bias filter. For instance, the plot 404 can represent the FET realization of a distributed amplifier excluding the capacitors C1 and C2, the resistors R1, R2, and R4, and the diode D1. Comparison of the plot 402 with the plot 404 shows that the P1 dB point is greater by at least 3 dB across the entire band when the distributed amplifier has the gate bias filter as shown in FIG. 2.

Figure 4B:
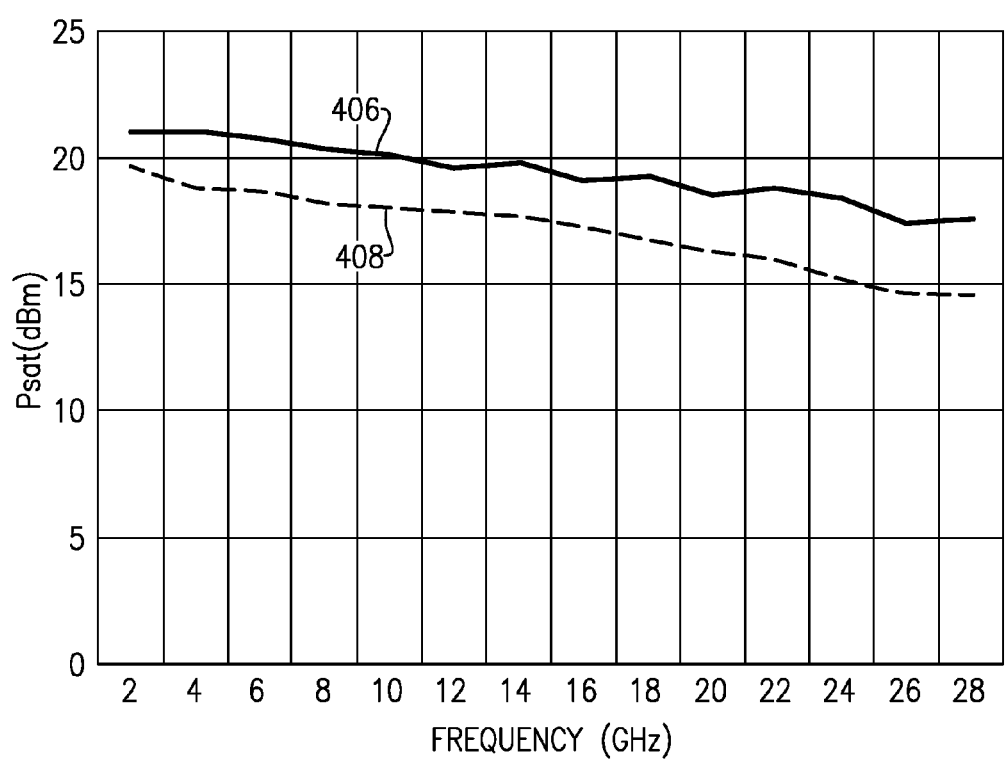
FIG. 4B illustrates measured results comparing a plot of the saturation power level Psat vs. frequency of a self-biased amplifier with a gate bias filter to a plot of Psat vs frequency of a self-biased amplifier without a gate bias filter.

FIG. 4B illustrates measured results comparing a plot 406 of the saturation power level Psat vs. frequency of a self-biased amplifier with a gate bias filter to a plot 408 of Psat vs frequency of a self-biased amplifier without a gate bias filter. FIG. 4B shows that there is also an improvement in the Psat across the entire band when the distributed amplifier has the gate bias filter as shown in FIG. 2.

Applications

Devices employing the above described self-biased distributed amplifiers with gate bias networks can be implemented into various electronic devices. Examples of the electronic devices can include, but are not limited to, consumer electronic products, parts of the consumer electronic products, electronic test equipment, etc. Examples of the electronic devices can also include circuits of optical networks or other communication networks. The consumer electronic products can include, but are not limited to, an automobile, a camcorder, a camera, a digital camera, a portable memory chip, a washer, a dryer, a washer/dryer, a copier, a facsimile machine, a scanner, a multifunctional peripheral device, etc. Further, the electronic device can include unfinished products, including those for industrial, medical and automotive applications.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An apparatus having adjustable amplifier bias, the apparatus comprising:
   a radio frequency (RF) power amplifier having at least an input terminal and an output node;
   a power detection circuit coupled to the output node, wherein the power detection circuit is configured to generate a detection output at a detection node; and
   a control path disposed between the detection node of the power detection circuit and the input terminal of the RF power amplifier, wherein the control path consists essentially of passive components, the passive components arranged to form at least a passive filter network, wherein the control path is configured to increase a bias of the RF power amplifier in response to the power detection circuit detecting an increase in power at the output node.

2. The apparatus of claim 1, wherein the RF power amplifier further comprises a plurality of amplification cells arranged as a distributed amplifier.

3. The apparatus of claim 1, wherein the power detection circuit is capacitively coupled to the output node.

4. The apparatus of claim 3, wherein the power detection circuit is configured to detect an envelope of a signal at the output node.

5. The apparatus of claim 1, wherein the power detection circuit is coupled to the output node by a coupled line coupler.

6. The apparatus of claim 1, wherein the passive filter network comprises a low-pass filter network comprising resistors and at least one storage element.

7. A method of amplifying, the method comprising:
   self biasing a radio frequency (RF) power amplifier, wherein the RF power amplifier has at least an input node and an output node;
   detecting an output power level of the RF power amplifier to generate a power detection signal;
   processing the power detection signal with passive components arranged to form at least a passive filter network and to generate a control signal; and
   applying the control signal to an input of the RF power amplifier to adjust a bias of the RF power amplifier to cause gain compression to be reduced in response to the power detection signal indicating an increase in the output power level.

8. The method of claim 7, wherein the RF power amplifier further comprises a plurality of amplification cells arranged as a distributed amplifier.

9. The method of claim 7, wherein the passive filter network comprises a low-pass filter network.

10. The apparatus of claim 1, wherein the RF power amplifier is a self-biased amplifier comprising a degeneration resistor.

11. The apparatus of claim 1, wherein the passive components include a first resistor electrically connected between a capacitor and a second resistor.

12. The apparatus of claim 1, wherein the passive components include a first resistor electrically connected between a cathode of a diode and a node between a second resistor and third resistor.

13. The apparatus of claim 12, wherein the second resistor is electronically connected between the node and a ground voltage, and the third resistor is electronically connected between the node and the input terminal to the RF power amplifier.

14. An apparatus for adjusting a bias of an amplifier, the apparatus comprising:
- a radio frequency (RF) power amplifier;
- means for detecting an output power level of the RF power amplifier to generate a power detection signal;
- means for processing the power detection signal with passive components to generate a control signal; and
- means for applying the control signal to an input of the RF power amplifier to provide a bias adjustment to the RF power amplifier such that the bias of the RF power amplifier is increased in response to the power detection signal indicating an increase in the output power level of the RF power amplifier.

15. The apparatus of claim 14, wherein the means for applying the control signal comprises a means for reducing gain compression of the RF power amplifier.

16. The apparatus of claim 14, wherein the passive components are arranged to form at least a passive filter network.

17. The apparatus of claim 14, wherein a capacitor and a resistor is connected between a source of a field effect transistor and ground in parallel.

18. The apparatus of claim 1, wherein the passive components include a capacitor and a resistor electrically connected between the input terminal of the RF power amplifier and the capacitor.

19. The method of claim 7, wherein the processing is performed by only the passive components.

20. The apparatus of claim 14, wherein the means for processing comprises an RC circuit electrically connected between an input terminal to the RF power amplifier and an output terminal of the RF power amplifier.

* * * * *